United States Patent
Bai

(10) Patent No.: US 8,619,906 B2
(45) Date of Patent: Dec. 31, 2013

(54) LOOK UP TABLE-BASED SUM PREDISTORTER FOR POWER AMPLIFIFICATION WITH CONCURRENT DUAL BAND INPUTS

(75) Inventor: Chunlong Bai, Kanata (CA)

(73) Assignee: Telefonaktiebolaget L M Ericsson (publ), Stockholm (SE)

(*) Notice: Subject to any disclaimer, the term of this patent is extended or adjusted under 35 U.S.C. 154(b) by 6 days.

(21) Appl. No.: 13/541,972

(22) Filed: Jul. 5, 2012

(65) Prior Publication Data

US 2013/0243123 A1 Sep. 19, 2013

Related U.S. Application Data

(60) Provisional application No. 61/611,093, filed on Mar. 15, 2012.

(51) Int. Cl.
*H04K 1/02* (2006.01)

(52) U.S. Cl.
USPC .......... 375/297; 375/130; 375/135; 375/146; 375/275; 375/284; 375/285; 375/295; 375/296

(58) Field of Classification Search
USPC ........ 375/130, 135, 146, 275, 284, 285, 295, 375/296, 297; 327/291; 332/106; 341/20, 341/173; 370/203, 204, 205, 208, 209, 210; 455/114.3, 552.1, 105, 93, 103
See application file for complete search history.

(56) References Cited

U.S. PATENT DOCUMENTS

| | | | |
|---|---|---|---|
| 7,539,464 B2 * | 5/2009 | Suzuki et al. | 455/114.3 |
| 7,634,238 B2 * | 12/2009 | Suzuki et al. | 455/114.3 |
| 8,380,144 B1 | 2/2013 | Bai et al. | |
| 8,520,773 B2 * | 8/2013 | Bai | 375/297 |

OTHER PUBLICATIONS

Bassam et al., "Linearization of Concurrent Dual-Band Power Amplifier Based on 2D-DPD Technique," IEEE Microwave and Wireless Components Letters, vol. 21(12) Dec. 2011 consisting of 4-pages.
Cidronali et al., "A New Approach for Concurrent Dual-Band IF Digital PreDistortion: System Design and Analysis," Department of Electronics and Telecommunications, University of Florence, V.S. Marta, 3, I-50139, Italy {first.last@unifi.it} IEEE 2008, 978-1-4244-2646-1/08 consisting of 4-pages.
International Search Report and Written Opinion dated Aug. 6, 2013 for International Application No. PCT/IB2013/051465, International Filing Date: Feb. 22, 2013 consisting of 13-pages.
Mkadem et al. "Physically Inspired Neural Network Model for RF Power Amplifier Behavioral Modeling and Digital Predistortion" EmRG Research Group, Dep. of Electrical and Computer Engineering, Universit of Waterloo, ON N2L-3G1 Canada. Manuscript revised Oct. 2010. consisting of 12-pages.

* cited by examiner

*Primary Examiner* — Dhaval Patel
(74) *Attorney, Agent, or Firm* — Christopher & Weisberg, P.A.

(57) ABSTRACT

A method and system for pre-distorting a dual band signal to compensate for distortion of a non-linear power amplifier in a radio transmitter are disclosed. In one embodiment, the first signal of the dual band signal is tuned to a first intermediate frequency to produce a first tuned signal and the second signal of the dual band signal is tuned to minus the intermediate frequency to produce a second tuned signal. A single input pre-distorter pre-distorts the sum of the first tuned signal and the second tuned signal. The coefficients of the pre-distorter are obtained from a one-dimensional look-up table.

20 Claims, 10 Drawing Sheets

LOOK UP TABLE-BASED SUM PREDISTORTER FOR POWER AMPLIFIICATION WITH CONCURRENT DUAL BAND INPUTS

CROSS-REFERENCE TO RELATED APPLICATION

This application is related to and claims priority to U.S. Provisional Patent Application Ser. No. 61/611,093, filed Mar. 15, 2012, entitled ARCHITECTURE ACHIEVING LOW POWER WITH A LOOK UP TABLE-BASED SUM PREDISTORTER FOR POWER AMPLIFICATION WITH CONCURRENT DUAL BAND INPUTS, the entirety of which is incorporated herein by reference.

TECHNICAL FIELD

The present invention relates to radio frequency (RF) transmitters and in particular to a pre-distortion method and system to compensate for non-linearities of a power amplifier in an RF transmitter.

BACKGROUND

A radio system includes a transmitter that transmits information-carrying signals to a receiver. The transmitter includes a power amplifier that operates to amplify the signal to be transmitted to a power level that is sufficient to enable receipt of the signal by the receiver. For the power amplifier to achieve high efficiency in terms of the ratio of peak power to average power, the power amplifier of a transmitter is operated in a non-linear region. This causes distortion of the input signal and broadening of the bandwidth of the input signal. To compensate for the distortion of the signal introduced by the power amplifier, the input signal is first passed through a pre-distorter that pre-distorts the input signal.

A typical pre-distorter is itself non-linear, having a non-linearity that compensates for the non-linearity of the pre-distorter. To illustrate, a power amplifier may exhibit first and third order effects characterized by a polynomial function of the input that may be written for third order non-linearities as:

$$y = f_{NL\text{-}IM3}(x) = a_1 x + a_3 x^3 \quad \text{(AW-01)}$$

where x is the input signal and $a_3$ is much less than $a_1$. The function f is the response of the power amplifier to the input x and the subscript NL-IM3 denotes non-linearity up to order three. To compensate for the distortion introduced by the power amplifier, a pre-distorter may have a response that is a polynomial function of the input:

$$z = f_{PD\text{-}IM3}(x) = b_1 x + b_3 x^3 \quad \text{(AW-02)}$$

Substituting equation AW-02 into equation AW-01 leads to:

$$y = f_{NL\text{-}IM3}(f_{PD\text{-}IM3}(x)) = a_1 b_1 x + (a_1 b_3 + a_3 b_1^3) x^3 + O(x^5) \quad \text{(AW-03)}$$

where $O(x^5)$ are terms of 5th order or higher. By appropriate selection of the coefficients $b_1$ and $b_3$, the third order term may be removed at the expense of creating higher order terms of less significant magnitude. The solution to achieve this is given by:

$$b_3 = -a_3 b_1^3 / a_1 \quad \text{(AW-04)}$$

Without loss of generality, assume that $a_1 = b_1 = 1$. Then the solution to compensate for third order distortions is:

$$b_3 = -a_3 \quad \text{(AW-05)}$$

This simple illustration is for third order non-linearities. For higher order non-linearities, the same approach may be taken to cancel the higher order terms. Thus, the pre-distorter is a non-linear device that compensates for the distortion caused by the power amplifier.

The bandwidth of the pre-distorter must be wider than the bandwidth of the input signal depending on the order of inter-modulation to be compensated by the pre-distorter. For example, for third order inter-modulations, the pre-distorted signal occupies about three times the bandwidth of the input signal to the pre-distorter. For fifth order inter-modulations, the pre-distorted signal occupies about 5 times the bandwidth of the input signal. Higher bandwidth implies that the sampling rate of the pre-distorted signal must be higher than the sampling rate of the sampled baseband signal from a modulator to avoid aliasing.

The problem of requiring a high sampling rate due to pre-distortion is exacerbated when the input signal is a dual band signal. Dual band signals arise when multiple wireless communication standards specify transmission using more than one frequency band, or when a single wireless communication standard specifies transmission using more than one frequency band. An up-converted dual band signal has a first continuous band at a first carrier frequency and a second continuous band at a second carrier frequency. The spacing between the carrier frequencies is such that the ratio of the carrier frequency spacing to the maximum individual bandwidth of a first or second band is very high so that a very large sampling rate is needed to avoid aliasing. A very high sampling rate is undesirable since a high clock rate may not be available within the system, and/or is more costly to implement, consumes additional power, etc.

One method of avoiding a higher sampling rate is to separately pre-distort each of the dual band signals in separate bands. One approach uses significant additional multiplication hardware to multiply the two separate signals by two separate sets of coefficients for pre-distorting the signals. Another approach uses a two-dimensional look-up table addressed by the two sets of coefficients to pre-distort the signal. These approaches are undesirable as being costly and complex to implement.

What is needed is a method and system for pre-distorting a dual band signal that does not depend upon a sampling rate that is much higher than the sampling rate of a baseband signal of one of the two bands. More particularly, what is needed is a method and system for pre-distorting a dual band signal that does not require multiplication of the dual band signal by two different sets of basis functions, does not require a two-dimensional look-up table, and does not require a very high sampling rate.

SUMMARY

The present invention advantageously provides a method and system for pre-distortion of dual band signals in a radio that transmits a first band of the dual band signal at a first carrier frequency and transmits a second band of the dual band signal at a second carrier frequency. According to one aspect, a first signal $s_1$ having first signal information is tuned to a first intermediate frequency to produce a first tuned signal. The first intermediate frequency is less than the first carrier frequency and less than the second carrier frequency. A second signal $s_2$ having second signal information is tuned to minus the first intermediate frequency to produce a second tuned signal. A sum of the first tuned signal and the second tuned signal is pre-distorted to produce a pre-distorted signal According to another aspect, the invention provides a method of pre-distorting a dual band signal to compensate for distortion of a power amplifier in a transmitter that transmits a first band of the dual band signal at a first carrier frequency and transmits a second band of the dual band signal at a second carrier frequency. A first signal $s_1$ having first signal information is tuned to a first intermediate frequency to produce a first tuned signal. The first intermediate frequency is less than the first carrier frequency and less than the second carrier frequency. A second signal $s_2$ having second signal information is also tuned to the first intermediate frequency to produce a second tuned signal. The first tuned signal is added to the second signal to produce a third signal and the second tuned signal is added to the first signal to produce a fourth signal. The third signal is input to a first pre-distorter applying a first set of basis functions to the third signal to produce a first pre-distorted signal having the first signal information at baseband. The fourth signal is input to a second pre-distorter applying the first set of basis functions to the fourth signal to produce a second pre-distorted signal having the second information signal at baseband.

According to another aspect, the invention provides an RF transmitter that includes a first tuner, a second tuner, and a pre-distorter. The first tuner tunes a first information signal $s_1$ to minus a first intermediate frequency to produce a first tuned signal. The first intermediate frequency is less than a first carrier frequency at which the RF transmitter transmits the first information signal. The second tuner tunes a second information signal $s_2$ to the first intermediate frequency to produce a second tuned signal. The first intermediate frequency is also less than a second carrier frequency at which the RF transmitter transmits the second information signal. The pre-distorter applies a set of basis functions to pre-distort a sum of the first tuned signal and the second tuned signal according to a set of basis functions to produce a pre-distorted signal.

BRIEF DESCRIPTION OF THE DRAWINGS

A more complete understanding of the present invention, and the attendant advantages and features thereof, will be more readily understood by reference to the following detailed description when considered in conjunction with the accompanying drawings wherein.

DETAILED DESCRIPTION

Figure 1:
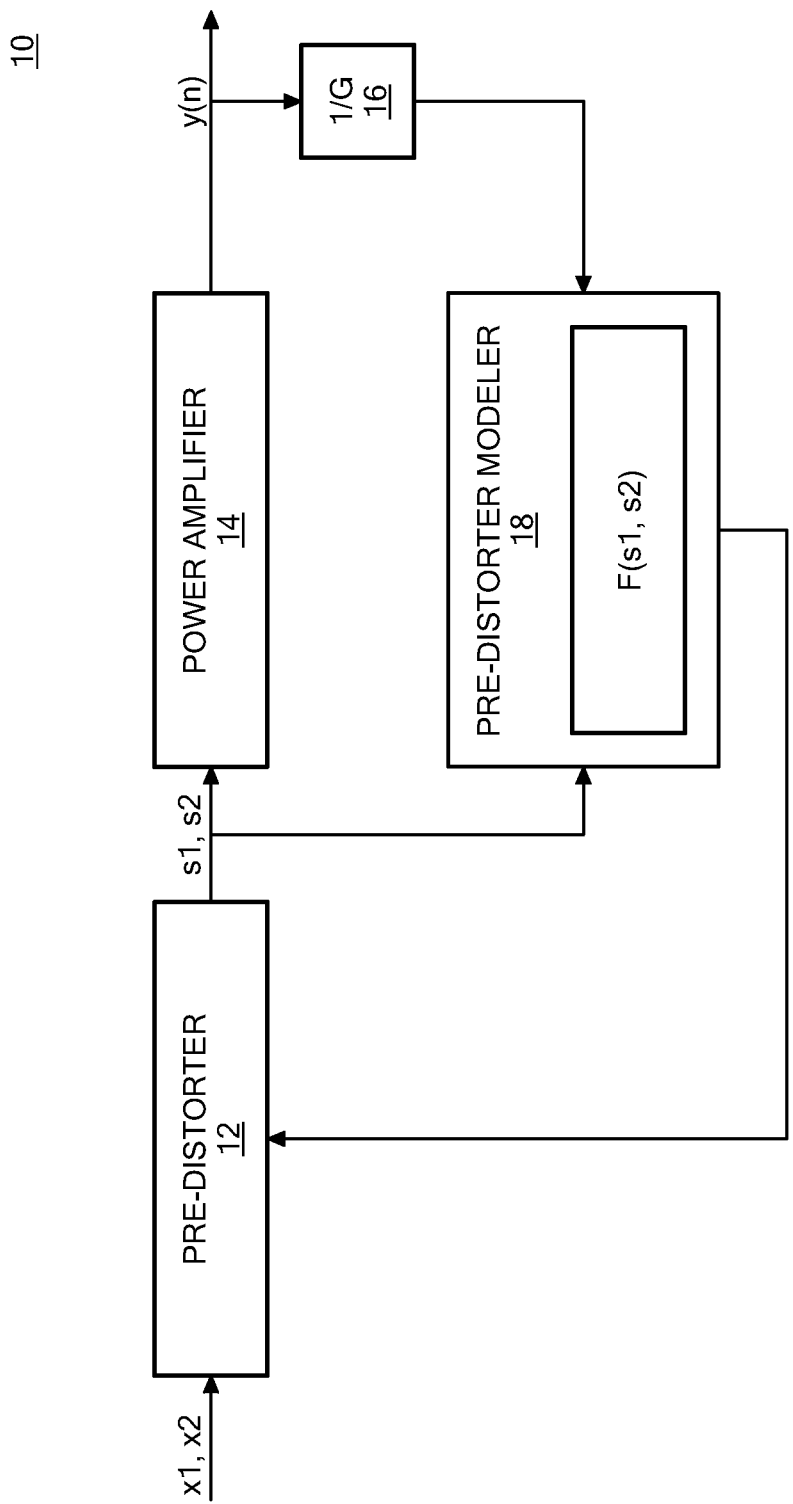
FIG. 1 is an exemplary block diagram of an RF transmitter front end constructed in accordance with principles of the present invention.

Before describing in detail exemplary embodiments that are in accordance with the present invention, it is noted that the embodiments reside primarily in combinations of apparatus components and processing steps related to signal pre-distortion in a radio of a wireless communication system. Accordingly, the system and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

As used herein, relational terms, such as "first" and "second," "top" and "bottom," and the like, may be used solely to distinguish one entity or element from another entity or element without necessarily requiring or implying any physical or logical relationship or order between such entities or elements.

Referring now to the drawing figures, in which like reference designators denote like elements, there is shown in FIG. 1 an exemplary block diagram of a dual band pre-distortion architecture constructed in accordance with the present invention, and generally denoted as system "10". System 10 includes a pre-distorter 12, a power amplifier 14, a multiplier 16, and a pre-distorter modeler 18. The pre-distorter 12 receives a dual band signal including a first signal x1 having signal energy predominantly in a first band A and a second signal x2 having signal energy predominantly in a second band B. In one embodiment, the pre-distorter 12 has two dual-input pre-distorters. A first dual-input pre-distorter pre-distorts a combination of the first and second signal according to a first set of basis functions and a first set of coefficients from the pre-distorter modeler 18, a second dual-input pre-distorter pre-distorts the combination of the first signal and the second signal according to a second set of basis functions and a second set of coefficients from the pre-distorter modeler 18. In another embodiment, the pre-distorter 12 includes a single one-input pre-distorter that separately pre-distorts the first and second signals according to two sets of basis functions that are the dual of one another. These different embodiments are described more fully below.

The outputs of the pre-distorter 12 are the pre-distorted signals s1 and s2. The pre-distorted signals are input to the power amplifier 14 and to the pre-distorter modeler 18. The power amplifier 14 amplifies and distorts the pre-distorted inputs. The pre-distorter coefficients and basis functions of the pre-distorter 12 are chosen by the pre-distorter modeler 18 so that the output of the power amplifier 14 is linearly related to the input signals x1 and x2 throughout an entire amplification range of the power amplifier 14. To accomplish this linearity, the pre-distorter modeler 18 receives the pre-distorted signals s1 and s2 and the output of the power amplifier 14 divided by the amplifier gain G by the multiplier 16.

Figure 2:
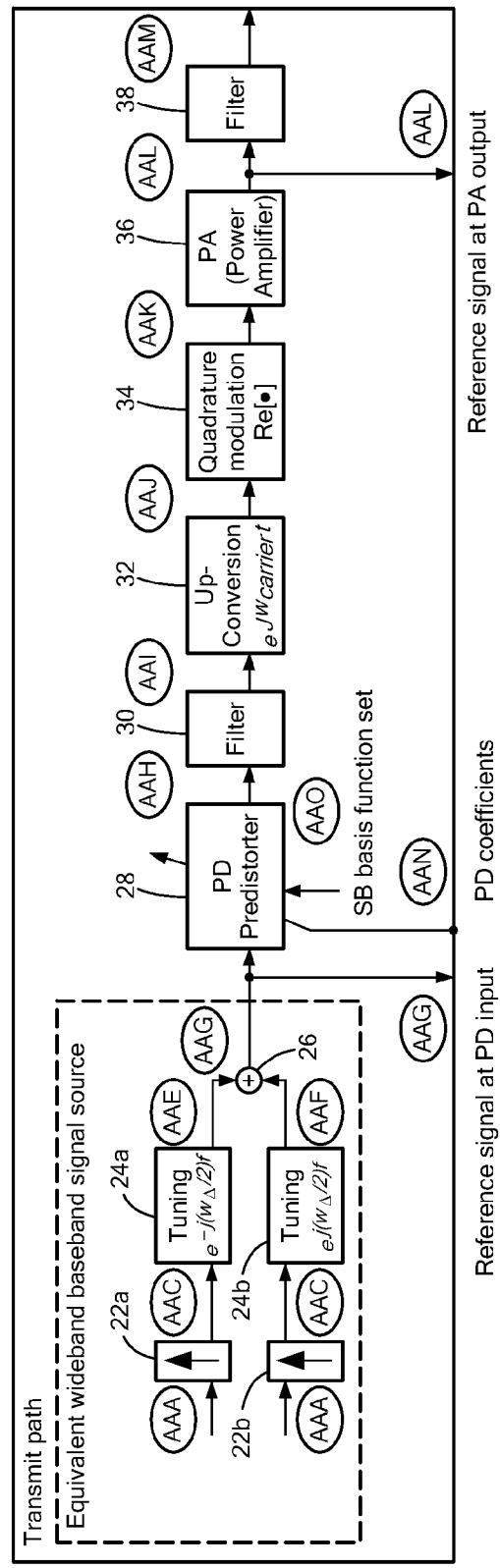
FIG. 2 is an exemplary block diagram of a wideband single band transmitter with a single-band pre-distorter constructed in accordance with principles of the present invention.

An exemplary single band pre-distortion architecture 20 is described with reference to FIG. 2. In FIG. 2, each oval label with letters designates a signal at a particular point in the circuit. For example, reference designator AAA denotes a first baseband signal having a frequency spectrum predominantly within a first band A. The reference designator AAB denotes a second baseband signal having a frequency predominantly within a second band B.

The first baseband signal is up-sampled by a first up-sampler 22a to produce a first up-sampled signal AAC denoted as:

$$s_{bb,band-A}(n) \quad (AA\text{-}01)$$

The second baseband signal is up-sampled by a second up-sampler 22b to produce a second up-sampled signal AAD denoted as:

$$s_{bb,band-B}(n) \quad (AA\text{-}02)$$

In equations AA-01 and AA-02, the subscript bb denotes baseband, the subscript A denotes band A and the subscript B denotes band B.

The first up-sampled baseband signal is tuned by a first tuner 24a to a first intermediate frequency to obtain a first tuned signal AAE obtained as follows:

$$s_{sb,if,band-A}(n) = s_{bb,band-A}(n) \cdot \exp(-j\pi f_{delta} n T_s) \quad (AA\text{-}03)$$

The second up-sampled baseband signal is tuned by a second tuner 24b to minus, i.e., the negative of, the first intermediate signal to obtain a second tuned signal AAF that is obtained as follows:

$$s_{sb,if,band-B}(n) = s_{bb,band-B}(n) \cdot \exp(j\pi f_{delta} n T_s) \quad (AA\text{-}04)$$

In equations AA-03 and AA-04, the subscript sb denotes single band and the subscript "if" denotes an intermediate frequency.

These signals are summed by an adder 26 to obtain an equivalent baseband signal AAG obtained as follows:

$$s_{sb,bb}(n) = s_{sb,if,band-A}(n) + s_{sb,if,band-B}(n) \quad (AA\text{-}05)$$

This signal is input to a pre-distorter 28 which pre-distorts the signal to produce a pre-distorted signal AAH as follows:

$$s_{sb,bb,pd}(n) = f_{pd}(s_{sb,bb}(n)) \quad (AA\text{-}06)$$

In equation AA-06, $f$ is a pre-distortion function which will be defined below. The subscript pd of the signal AAH $s_{sb,bb,pd}(n)$ denotes that the signal is predistorted. The pre-distorter 28 also receives a set of pre-distortion coefficients AAN denoted as a vector $w_{sb,bb}(n)$ and a set of basis functions AAO denoted as a vector function $F_{sb,bf}(\bullet)$. The coefficients AAN and basis functions AAO will be described subsequently in this application.

Considering only third order non-linearities, the pre-distorted signal AAH $s_{sb,bb,pd}(n)$ has energy primarily in four frequency bands as follows:

$$s_{bb,pd,band-A}(n) \cdot \exp(-j\pi f_{delta} n T_s) \quad (AA\text{-}07)$$

$$s_{bb,pd,band-B}(n) \cdot \exp(j\pi f_{delta} n T_s) \quad (AA\text{-}08)$$

$$s_{bb,pd,band-C}(n) \cdot \exp(-3\pi f_{delta} n T_s) \quad (AA\text{-}09)$$

$$s_{bb,pd,band-D}(n) \cdot \exp(j3\pi f_{delta} n T_s) \quad (AA\text{-}10)$$

As used herein, the indexing of the bands are in order of increasing absolute value of their center frequency, and negative then positive for bands that have the same absolute value of their center frequency. In the above example, in the frequency domain, the bands are labeled A, B, C and D. Both alphabetical and numerical indexing may be used interchangeably herein. Thus, band A and band 1 are the same band, band B and band 2 are the same band, band C and band 3 are the same band, etc. It follows that the signal AAH can be expressed as:

$$s_{sb,bb,pd}(n) = s_{bb,pd,band-A}(n) \cdot \exp(-j\pi f_{delta} n T_s) + \quad (AA\text{-}11)$$

$$s_{bb,pd,band-B}(n) \cdot \exp(j\pi f_{delta} n T_s) +$$

-continued $$s_{bb,pd,band-C}(n) \cdot \exp(-j3\pi f_{delta} n T_s) +$$

$$s_{bb,pd,band-D}(n) \cdot \exp(j3\pi f_{delta} n T_s)$$

The signal AAH may be input to a band pass filter 30, which filters out the portion of the signal AAH that is in the band C and that is in the band D to produce a new signal AAI as follows:

$$s_{sb,bb,pd,band-AB}(n) = s_{bb,pd,band-A}(n) \cdot \exp(-j\pi f_{delta} n T_s) + s_{bb,pd,band-B}(n) \cdot \exp(j\pi f_{delta} n T_s) \quad (AA\text{-}12)$$

The subscript band-AB denotes that the signal exhibits energy primarily in band A and in band B. In the above equations, the following notations are assumed:

$f_{c1}$ and $f_{c2}$ are the carrier frequencies of the first band A and second band B, respectively;

$b_{w1}$ and $b_{w2}$ are the bandwidths of the baseband signals for the first band A and second band B, respectively;

$f_{delta} = (f_{c2} - f_{c1})$ is the frequency span between the carrier frequencies of the two bands;

$f_c = (f_{c1} - f_{c1})/2$ is the carrier frequency if the dual band signal is considered as a single band wideband signal.

Block diagram 20 illustrates the solution of a single band predistortion architecture, where the input dual band signal to the power amplifier is treated as a single band wide band signal. In this case: The bandwidth of the single band signal based on the above assumptions is:

$$f_{delta} + (bw_1 + bw_2)/2 \quad (AA\text{-}15)$$

In blocks 24a and 24b, the intermediate frequency for predistortion, fif-pd, is chosen to be $f_{if-pd} = f_{delta}/2$. The bandwidth of the predistorted signal is 3× and 5× the bandwidth shown in equation (AA-15) considering a maximum of 3rd and 5th order, respectively, of distortion to be counteracted. Accordingly, the predistorter 28 should operate at a sampling frequency of 3* and 5* the bandwidth shown in equation (AA-15), considering the case where $f_{delta} \gg (bw1+bw2)/2$, where $\gg$ means 'much larger than', and the sampling rate is $3*f_{delta}$ or $5*f_{data}$, respectively.

The signal AAI is up-converted by an up-converter 32 to a carrier frequency $f_c$ to produce a signal AAJ as follows:

$$s_{bb,pd,band-AB} \cdot \exp(j2\pi f_c T_s)$$

The signal AAJ is input to a quadrature modulator 34 to produce a quadrature modulated signal AAK as follows:

$$s_{sb,rf,pd,band-AB}(n) = \text{Re}[s_{sb,bb,pd,band-AB} \cdot \exp(j2\pi f_c T_s)] \quad (AA\text{-}13)$$

$$= \text{Re}[s_{sb,bb,pd,band-AB}(n)]\cos(j2\pi f_c T_s) -$$

$$\text{Im}[s_{sb,bb,pd,band-AB}(n)]\sin(j2\pi f_c T_s)$$

The subscript "rf" denotes that the signal is a radio frequency (RF) signal centered at the carrier frequency. The signal AAK is input to the power amplifier 36 to produce an amplified RF signal AAL as follows:

$$G_{pa} \cdot s_{sb,rf,nl-pd}(n) = G_{pa} \cdot f_{nl}(s_{sb,rf,nl-pd,band-AB}(n)) \quad (AA\text{-}14)$$

where $G_{pa}$ is the gain of the power amplifier and $f_{nl}$ denotes the non-linear function of the power amplifier 36.

It is noted that the intermediate frequency $f_{if-pd}$ may be chosen to be less than half the carrier frequency span $f_{delta}/2$ so that the sample rate of the signal in the pre-distorter need not be as high as proportional to the carrier frequency span $f_{delta}$. In other words it is desirable that the intermediate frequency in tuners 24a and 24b, as well as the sampling rate in the pre-distorter, are functions only of the parameters $b_{w1}$ and $b_{w2}$; and not a function of $f_{delta}$.

Once again considering only third order non-linearities, due to the non-linearity of the power amplifier 26, the signal AAL has energy in bands C and D as well as bands A and B. Thus, the signal AAL is filtered by a filter 38 to produce the output signal AAM as follows:

$$G_{pa} \cdot s_{sb,rf,nl-pd,band-AB}(n) \quad (AA-20)$$

where $$s_{sb,rf,nl-pd,band-AB}(n) = s_{sb,rf,nl-pd,band-A}(n) + s_{sb,rf,nl-pd,band-B}(n) \quad (AA-21)$$

Because of the pre-distortion applied to the signal by the pre-distorter 28 to compensate for the distortion introduced by the power amplifier 36, there is a substantially linear relationship between the signal AAG and the signal AAM.

Figure 3:
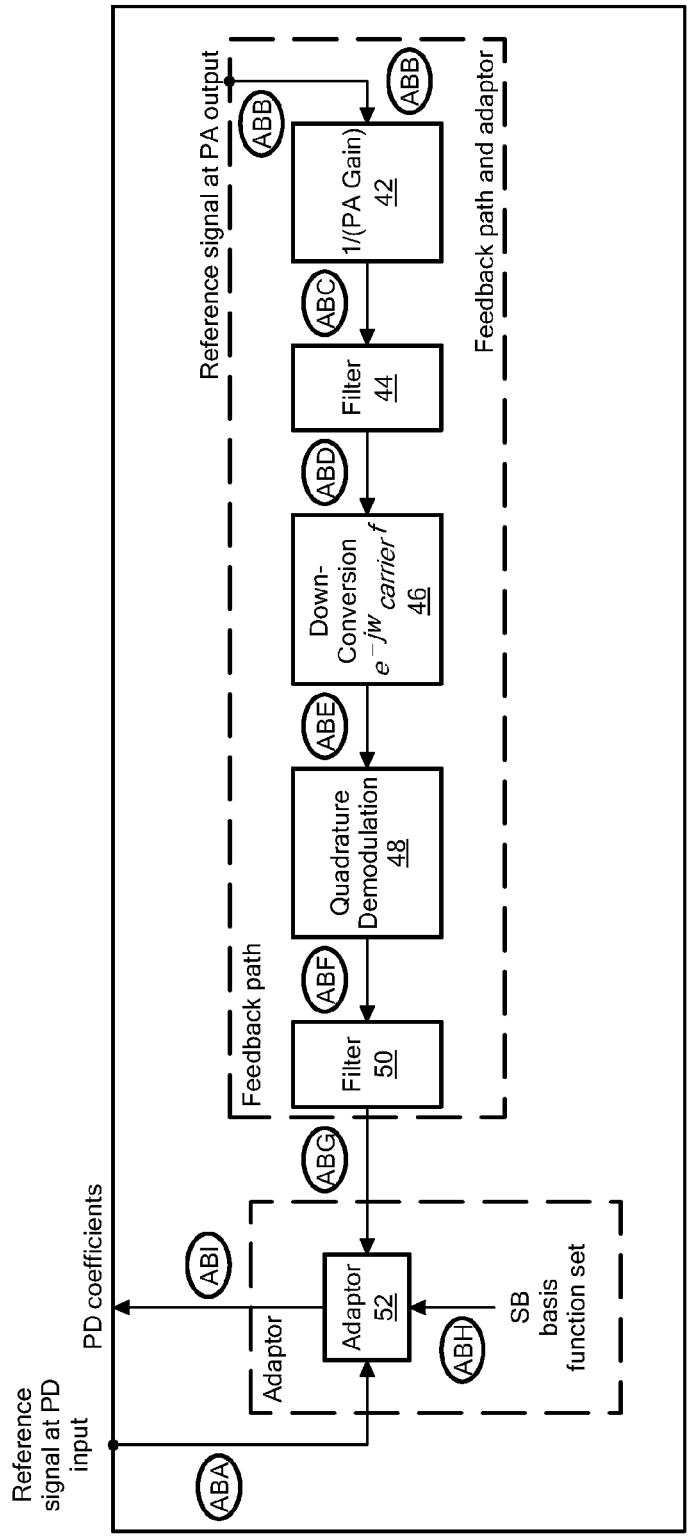
FIG. 3 is an exemplary block diagram of a pre-distortion modeler usable in conjunction with the wideband single band transmitter of FIG. 2.

FIG. 3 shows an exemplary pre-distorter modeler circuit 40 to be used in conjunction with the single band pre-distortion architecture 20. Circuit 40 receives two input signals labeled ABA and ABB. The input signal ABA is the same as the signal AAG given by equation AA-05, i.e., the input to the pre-distorter 28, repeated here for convenience:

$$s_{sb,bb}(n) \quad (AB-01)$$

The input signal ABB is the output signal AAL from the power amplifier 36 of FIG. 2 given by equation AA-20, repeated here for convenience:

$$G_{pa} \cdot s_{sb,rf,nl-pd}(n)$$

The signal ABB is normalized by dividing by the Gain ($G_{pa}$) of the power amplifier 36 by a multiplier, amplifier or attenuator 42 to yield the signal ABC, expressed as:

$$s_{sb,rf,nl-pd}(n) \quad (AB-03)$$

Reference signal ABB is introduced for modeling purposes. In one embodiment, instead of a direct connection between AAL and ABB, an RF coupler is used to obtain ABB as an attenuated version of the power amplifier output AAL. Another attenuator is used to obtain the signal ABC as expressed in equation (AB-04).

The signal ABC is input to a filter 44. Filter 44 filters the signal ABC to substantially filter out energy in the bands C and D to produce signal ABD as follows:

$$s_{sb,rf,nl-pd,band-AB}(n) \quad (AB-04)$$

This is also the signal given by equation AA-21. The signal ABD is input to a down converter 46 which down converts by $-f_c$ to produce a baseband signal ABE given by:

$$s_{sb,rf,nl-pd,band-AB}(n) \cdot \exp(-j2\pi f_c) \quad (AB-05)$$

This signal has a baseband component centered at zero frequency and an out-of-band component centered at $2f_c$, which can be expressed as:

$$s_{sb,rf,nl-pd,band-AB}(n) \cdot \exp(-j2\pi f_c) = s_{sb,bb,nl-pd,band-AB}(n) + s_{sb,rf-cob,nl-pd,band-AB}(n) \quad (AB-06)$$

The signal ABE is quadrature-demodulated by a quadrature demodulator 48 to produce an intermediate signal ABF, which in turn is filtered by filter 50 to remove the out of band component centered at $2f_c$ to produce a signal ABG, which is the desired feedback signal given by:

$$s_{sb,bb,nl-pd,band-AB}(n) \quad (AB-07)$$

The signal ABG is input to the adaptor 52. The adaptor also receives the signal ABA given by AB-01 above:

$$s_{sb,bb}(n) \quad (AB-01)$$

The adaptor 52 further receives the basis function set ABH which are the same basis functions AAO $F_{sb,bf}(\cdot)$ given above as input to the pre-distorter 28. The output of the adapter 52 is the set of coefficients ABI which are the same coefficients AAN $w_{sb,bb}(n)$ given above as input to the pre-distorter 28.

Figure 4:
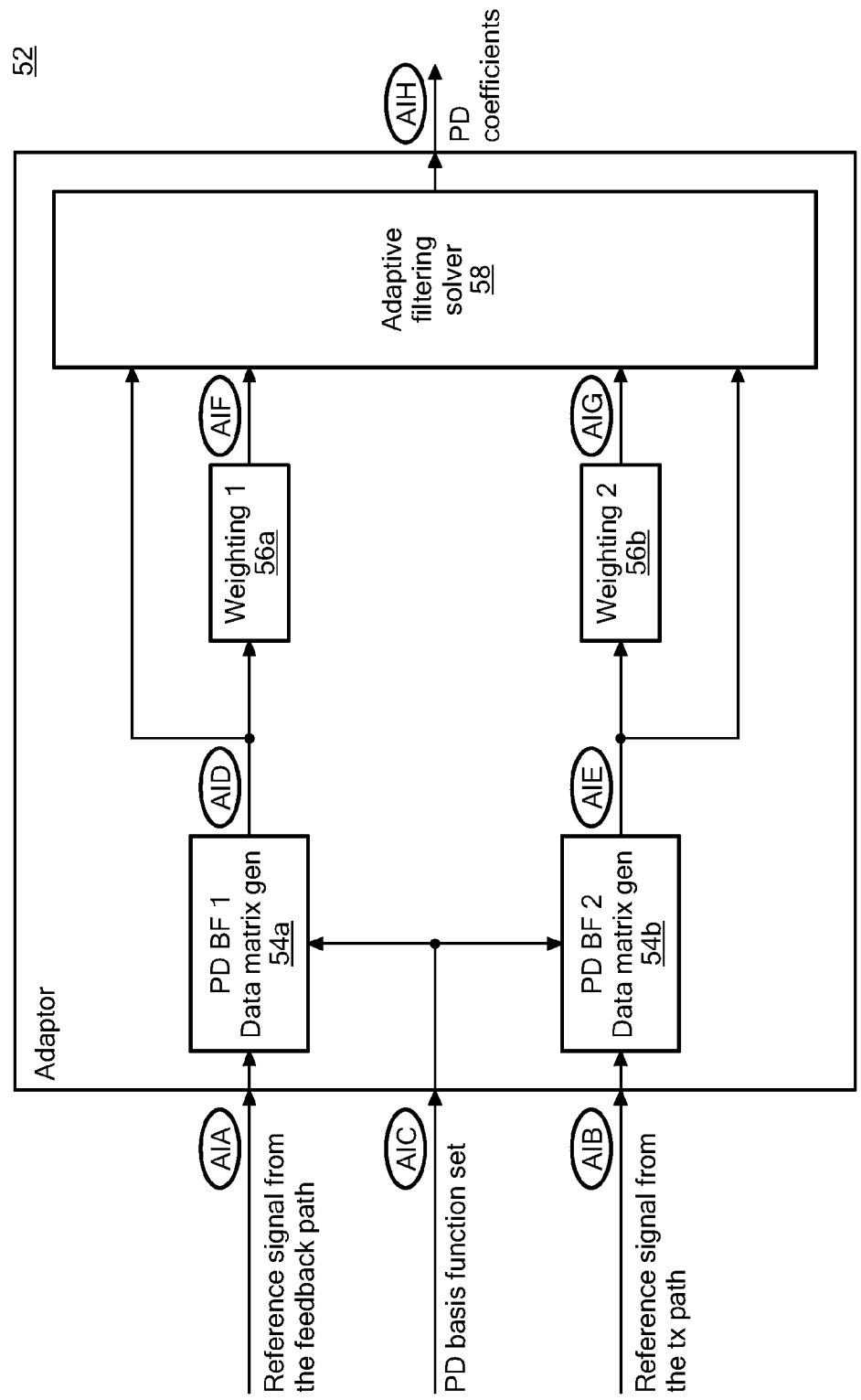
FIG. 4 is an exemplary block diagram of an adaptor for computing coefficients for a pre-distorter constructed in accordance with principles of the present invention.

FIG. 4 shows a more detailed view of the adaptor 52. As discussed above, the adaptor 52 has three inputs:

$$AIA = ABG = s(n) \quad (AI-01)$$

$$AIB = ABA = s'(n) \quad (AI-02)$$

$$AIC = ABH = F_{sb,bf}(\cdot) \quad (AI-05)$$

The reference signal s(n) is input to a first data matrix generator 54a to produce a first matrix AID given by:

$$A_i = [a(n_0), a(n_1), \ldots, a(n_{N-1})]^T \quad (AI-06)$$

where $$a(n) = F_{bf}(s(n)) \quad (AI-05)$$

$$a(n) = [a_0(n), a_1(n), \ldots, a_{P-1}(n)]^T \quad (AI-04)$$
$$= [f_{bf,0}(s(n)), f_{bf,1}(s(n)), \ldots, f_{bf,P-1}(s(n))]^T$$

a(n) is a PX1 vector, superscript T denotes the transpose operation, and $A_i$ is an NXP matrix, and where $$a_p(n) = f_{bf,p}(s(n)) \quad (AI-03)$$

The matrix $A_i$ contains the response of the basis function set to input s(n) over $n = n_o, n_l, n_{N-1}$, where N is the number of samples used for adaptation iteration, i, where i is the iteration index.

The reference signal s'(n) is input to a second data matrix generator 54b to produce a second matrix AIE given by:

$$A'_i = [a'(n_0), a'(n_1), \ldots, a'(n_{P-1})]^T \quad (AI-07)$$

where $$a'(n) = F_{bf}(s'(n)) \quad (AI-08)$$

The signal AID of equation AI-06 is input to a first multiplier 56a which multiplies the signal AID by a set of weights, w, as follows:

$$A_i \cdot w_i = b_i = [b(n_0), b(n_1), \ldots, b(n_{N-1})]^T \quad (AI-09)$$

where $$w_i = [w_{i,0}, w_{i,1}, \ldots, w_{i,P-1}]^T \quad (AI-10)$$

vector b is an NX1 vector, w is a PX1 vector, and the signal AIF is $$b(n) = \Sigma_{p=0}^{P-1} a_p(n) \cdot w_{i,p} \quad (AI-11)$$

The signal AIF b(n) is the weighted summation of the responses of the basis function set to the input s(n).

Similarly, the signal AIE of equation AI-07 is input to a second multiplier 56b which multiplies the signal AIE by the set weights, w, as follows:

$$A'_i \cdot w_i = b'_i = [b'(n_0), b'(n_1), \ldots, b'(n_{N-1})]^T \quad (AI-12)$$

where the signal MG is $$b'(n) = \Sigma_{p=0}^{P-1} a'_p(n) \cdot w_{i,p} \quad (AI-13)$$

The vector b' (n) is readily available from the transmit path of FIG. 2 as signal AAH, namely, the output of the pre-distorter 28. Thus, the blocks between MB and AIG may be omitted, with the signal MG being obtained from the pre-distorter 28.

The weights $w_{i+1}$ are calculated by an adaptive solver 58 by solving the following equation for $w_{i+1}$:

$$A_i \cdot w_{i+1} = b'_i \quad \text{(AI-14)}$$

where the subscript i+1 means iteration number i+1. The output of the adaptive solver 58 is labeled AIH and is an input AAN to the pre-distorter 28.

Figure 5:
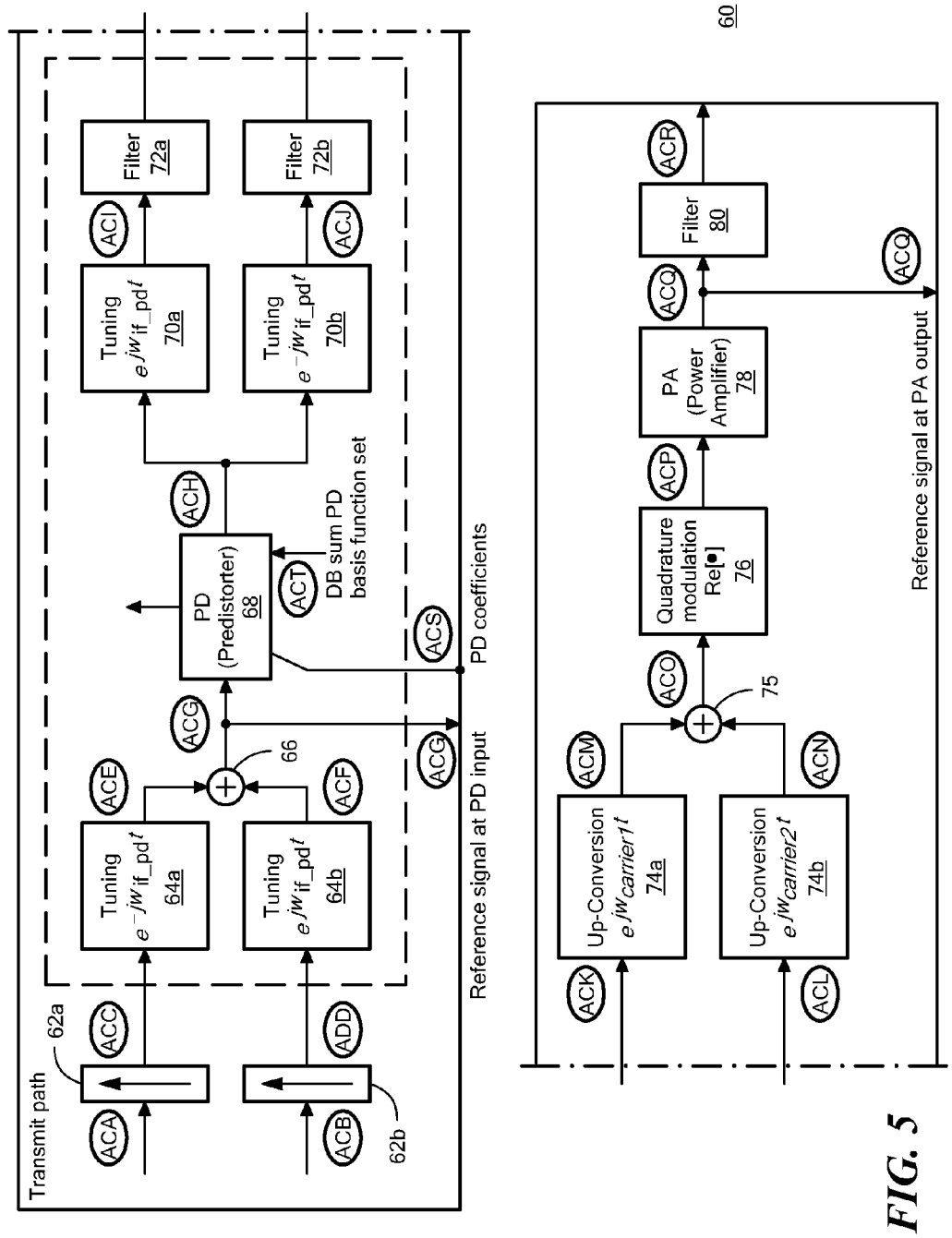
FIG. 5 is an exemplary block diagram of a dual band sum pre-distortion architecture constructed in accordance with principles of the present invention.

FIG. 5 is a block diagram of an exemplary embodiment of a dual band sum pre-distortion transmit circuit 60. The reference designator ACA denotes a first baseband signal having a frequency spectrum predominantly within a first band A. The reference designator ACB denotes a second baseband signal having a frequency predominantly within a second band B.

The first baseband signal is up-sampled by a first up-sampler 62a to produce a first up-sampled signal ACC denoted as:

$$s_{bb,band-A}(n) \quad \text{(AC-01)}$$

where, the subscript bb denotes baseband and band-A indicates the signal energy is predominantly in band A. The second baseband signal is up-sampled by a second up-sampler 62b to produce a second up-sampled signal ACD denoted as:

$$s_{bb,band-B}(n) \quad \text{(AC-02)}$$

The first baseband signal ACC is input to a first tuner 64a to produce the signal ACE as follows:

$$s_{db-sum,if,band-A}(n) = s_{bb,band-A}(n) \cdot \exp(-j2\pi f_{if-pd} nT_s) \quad \text{(AC-03)}$$

where "if" denotes an intermediate frequency, $T_s$ is the sampling rate, db-sum denotes the dual band sum architecture, and if-pd denotes the intermediate frequency used by the pre-distorter 68.

Similarly, the second baseband signal ACD is input to second tuner 64b to produce the signal ACF as follows:

$$s_{db-sum,if,band-B}(n) = s_{bb,band-B}(n) \cdot \exp(j2\pi f_{if-pd} nT_s) \quad \text{(AC-04)}$$

Note that the intermediate frequency $f_{if}$ may be chosen to be less than a carrier frequency at which the signal is transmitted so that the sample rate of the signal in the pre-distorter need not be as high as the sample rate that would be required if the center frequencies of the two-upconverted baseband signals were separated by $2f_c$. More particularly, the sampling frequency at the pre-distorter need only be based on the lower $2f_{if}$ separation of the baseband signals caused by the tuners 64a and 64b. The equation for the intermediate frequency is given by:

$$f_{IF\_PD\_MIN} = \frac{1}{4}BW_1 + \frac{1}{4}BW_2 + k \cdot \max(BW_1, BW_2)$$

where $f_{IF\_PD\_MIN}$ is the minimum intermediate frequency that does not result in aliasing. BW1 and BW2 are the bandwidths of the signals in bands 1 and 2, respectively, and 2k+1 is the maximum order of the intermodulation under consideration.

The two signals, ACE and ACF, are added together at an adder 66 to produce the signal ACG as follows:

$$s_{db-sum,bb}(n) = s_{db-sum,if,band-A}(n) + s_{db-sum,if,band-B}(n) \quad \text{(AC-05)}$$

Signal ACG is the input to the pre-distorter 68. Signal ACG is also input to an adaptor such as the adaptor of FIG. 4 at signal MB. The output of the pre-distorter is the signal ACH, as follows:

$$s_{db-sum,bb,pd}(n) = f_{db-sum,pd}(s_{db-sum,bb}(n)) \quad \text{(AC-06)}$$

where $f_{db-sum,pd}(\bullet)$ is a predistortion function for this dual band sum predistortion architecture, and the subscript "pd" denotes that the resultant signal is pre-distorted. The predistorter also receives pre-distortion coefficients ACS and a set of basis functions ACT.

The output of the pre-distorter 68 has energy primarily in four bands, A, B, C, and D, as follows:

$$\begin{aligned}
s_{db-sum,bb,pd}(n) = &\, s_{db-sum,bb,pd,band-A}(n) \cdot \exp(-j2\pi f_{if-pd} nT_s) + \\
&\, s_{db-sum,bb,pd,band-B}(n) \cdot \exp(j2\pi f_{if-pd} nT_s) + \\
&\, s_{db-sum,bb,pd,band-C}(n) \cdot \exp(-j6\pi f_{if-pd} nT_s) + \\
&\, s_{db-sum,bb,pd,band-D}(n) \cdot \exp(j6\pi f_{if-pd} nT_s)
\end{aligned} \quad \text{(AC-11)}$$

Note that the sampling rate and intermediate frequency must be chosen so that there is no aliasing of the signals in the different bands. The bands A and B of the pre-distorted signal are broader than the corresponding bands of the input signal to the pre-distorter. Further, since the separation of the bands A and B are $2f_{if}$, the sampling rate at the pre-distorter can be much less than the sampling rate that would be required if the bands were at carrier frequencies $f_{c1}$ and $f_{c2}$.

The output ACH of the predistorter is split and input to two tuners 70a and 70b. Tuner 70a tunes the signal ACH as follows:

$$\begin{aligned}
s_{db-sum,bb,pd}(n) \cdot \exp(j\pi f_{if-pd} nT_s) = &\, s_{db-sum,bb,pd,band-A}(n) + \\
&\, s_{db-sum,bb,pd,band-B}(n) \cdot \exp(j4\pi f_{if-pd} nT_s) + \\
&\, s_{db-sum,bb,pd,band-C}(n) \cdot \exp(-j4\pi f_{if-pd} nT_s) + \\
&\, s_{db-sum,bb,pd,band-D}(n) \cdot \exp(j8\pi f_{if-pd} nT_s)
\end{aligned} \quad \text{(AC-12)}$$

which is the signal labeled ACI. The tuner 70b tunes the signal ACH as follows:

$$\begin{aligned}
s_{db-sum,bb,pd}(n) \cdot \exp(-j\pi f_{if-pd} nT_s) = &\, \\
s_{db-sum,bb,pd,band-A}(n) \cdot \exp(-j4\pi f_{ifpd} nT_s) + &\, \\
s_{db-sum,bb,pd,band-B}(n) + &\, \\
s_{db-sum,bb,pd,band-C}(n) \cdot \exp(-j8\pi f_{if-pd} nT_s) + &\, \\
s_{db-sum,bb,pd,band-D}(n) \cdot \exp(j4\pi f_{if-pd} nT_s) &\,
\end{aligned} \quad \text{(AC-13)}$$

which is the signal labeled ACJ.

The signal ACI is filtered by a first filter 72a to produce the pre-distorted baseband signal ACK as follows:

$$s_{db-sum,bb,pd,band-A}(n) \quad \text{(AC-14)}$$

Similarly, the signal ACJ is filtered by a second filter 72b to produce the pre-distorted baseband signal ACL as follows:

$$s_{db-sum,bb,pd,band-B}(n) \quad \text{(AC-15)}$$

These signals are then input to up-converters 74a and 74b to produce the signals ACM and ACN, respectively, as follows:

$$s_{db-sum,bb,pd,band-A}(n) \cdot \exp(j2\pi f_{c1} nT_s) \quad \text{(AC-18)}$$

and $$s_{db-sum,bb,pd,band-B}(n) \cdot \exp(j2\pi f_{c2} nT_s) \quad \text{(AC-19)}$$

The signals ACM and ACN are summed by an adder 75 to produce the signal ACO, which is input to a quadrature modulator 76 to produce the quadrature-modulated signal ACP as follows;

$$s_{db-sum,rf,pd,band-AB}(n) = \text{Re}[s_{db-sum,bb,pd,band-A}(n) \cdot \quad (AC-20)$$
$$\exp(2j\pi f_{c1}nT_s)] +$$
$$\text{Re}[s_{db-sum,bb,pd,band-B}(n) \cdot$$
$$\exp(2j\pi f_{c2}nT_s)]$$
$$= \text{Re}[s_{db-sum,bb,pd,band-A}(n)]$$
$$\cos(j2\pi f_{c1}T_s) -$$
$$\text{Im}[s_{db-sum,bb,pd,band-A}(n)]$$
$$\sin(j2\pi f_{c1}T_s) +$$
$$\text{Re}[s_{db-sum,bb,pd,band-B}(n)]$$
$$\cos(j2\pi f_{c2}T_s) -$$
$$\text{Im}[s_{db-sum,bb,pd,band-B}(n)]$$
$$\sin(j2\pi f_{c2}T_s)$$

Here, the subscript "rf" denotes that the signals are at radio frequency (RF) carrier frequencies $f_{c1}$ and $f_{c2}$.

The predistorted RF signal ACP is input to a power amplifier 78, which amplifies and distorts the pre-distorted signal to produce a signal ACQ with energy in frequency bands A, B, C, and D as follows:

$$G_{pa} \cdot s_{db-sum,rf,nl-pd}(n) = G_{pa} \cdot f_{nl}(s_{db-sum,rf,nl-pd,band-AB}(n)) \quad (AC-21)$$

where $G_{pa}$ is the gain of the power amplifier and where:

$$s_{db-sum,rf,nl-pd}(n) = s_{db-sum,rf,nl-pd,band-A}(n) + s_{db-sum,rf,nl-pd,band-B}(n) + s_{db-sum,rf,nl-pd,band-C}(n) + s_{db-sum,rf,nl-pd,band-D}(n) \quad (AC-26)$$

There is a substantially linear relationship between the signal ACG and the signal ACQ resulting from the pre-distortion applied to the signal by the pre-distorter 68 to compensate for the distortion introduced by the power amplifier 78.

The signal ACQ is then filtered by a filter 80 to remove the components of the signal in bands C and D, to produce the signal ACR as follows:

$$G_{pa} \cdot s_{db-sum,rf,nl-pd,band-AB}(n) \quad (AC-27)$$

where $$s_{db-sum,rf,nl-pd,band-AB}(n) = s_{db-sum,rf,nl-pd,band-A}(n) + s_{db-sum,rf,nl-pd,band-B}(n) \quad (AC-28)$$

Figure 6:
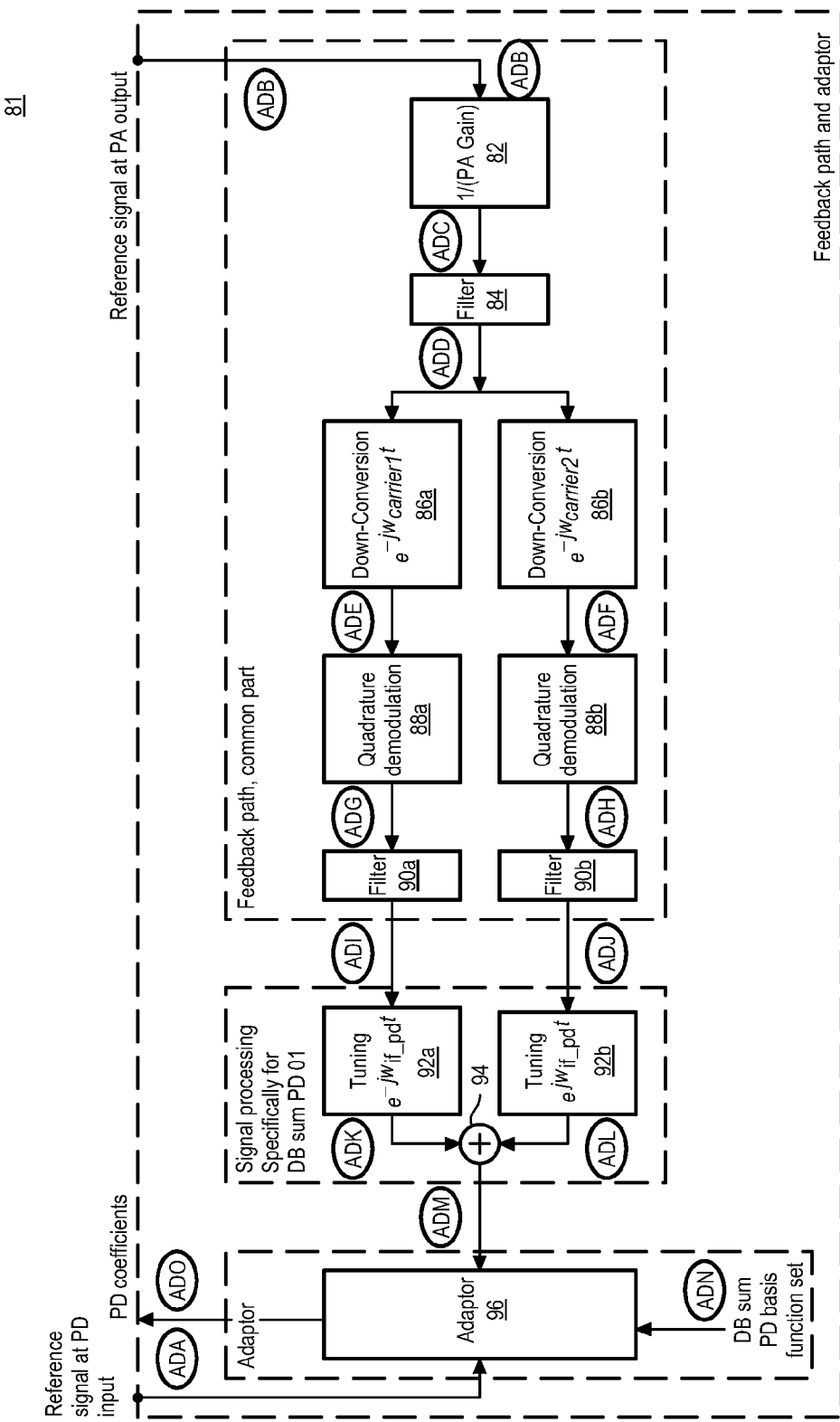
FIG. 6 is an exemplary block diagram of a pre-distortion modeler usable in conjunction with the architecture of FIG. 5.

FIG. 6 shows a pre-distortion modeler circuit 81 used in conjunction with the dual band sum pre-distortion transmit circuit 60. Circuit 81 has two inputs, ADA, and ADB. The input signal ADA is the signal ACG from circuit 60. The input signal ADB is the output signal ACQ from the power amplifier 78 in FIG. 5.

The input signal ADB is normalized by the gain of the power amplifier 78 by a multiplier 82. The output of the multiplier 82 is labeled signal ADC and is input to a filter 84 to produce signal ADD. Signal ADD is split and sent to down-converters 86a and 86b to produce down-converted baseband signals ADE and ADF. The down-converted signals ADE and ADF are demodulated by quadrature demodulators 88a and 88b, respectively, to produce demodulated signals ADG and ADH. These signals are filtered by filters 90a and 90b, respectively to produce signals ADI and ADJ. The signals ADI and ADJ are tuned to intermediate frequency by tuners 92a and 92b respectively. The outputs of the tuners are summed by adder 94 to produce signal ADM, which is input to the adaptor 96.

An adaptor 96 operates as described above with reference to FIG. 4. The signal AIA in this case corresponds to the signal ADM and the signal MB corresponds to the signal ADA. The signal MC corresponds to the signal ADN of FIG. 6 and signal ACT of FIG. 5. The signal AIH corresponds to the signal ADO of FIG. 6 and the signal ACS of FIG. 5. Signals MC and ADN correspond to signals ACT and ACS of FIG. 5.

Figure 7:
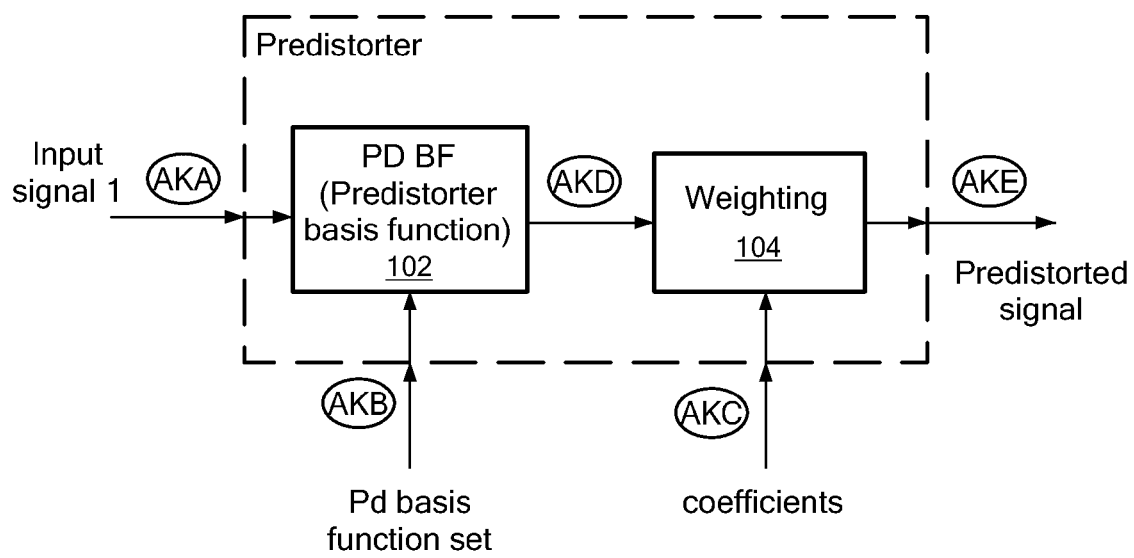
FIG. 7 is an exemplary block diagram of a single-input pre-distorter constructed in accordance with principles of the present invention.

FIG. 7 is a block diagram of the pre-distorter 68 of FIG. 5. The pre-distorter 68 has a pre-distortion unit 102 that receives the signal labeled AKA, which corresponds to the signal ACG of FIG. 5. The pre-distortion unit 102 also receives the basis functions AKB, f, which correspond to the basis functions ACT of FIG. 5 and MC of FIG. 4. The output AKD of the pre-distortion unit 102 is input to a multiplier 104 which multiplies the signal AKD by the coefficients AKC, w, which correspond to the coefficients ADO from the adaptor 96 of FIG. 6, and the coefficients MH of FIG. 4, and which correspond to the coefficients ACS of FIG. 5.

The pre-distortion unit 102 performs the following operation on the input signal AKA:

$$a_{bb,p}(n) = f_{bf,p}(s_{bb}(n)) \quad (AK-02)$$

for each basis function, where $f_{bf,p}$ is the p-th basis function in the basis function set at input AKB, $s_{bb}(n)$ is the input signal AKA which is the same as the signal of equation AC-05, and $a_{bb,p}(n)$ is the response of the basis function to the signal $s_{bb}(n)$. Note that P is the number of basis functions corresponding to the order of non-linearity to be corrected. For example, if correction of non-linear terms of order 3 are to be corrected, then P=2. If correction of non-linear terms of order 5 are to be corrected, then P=4.

Thus, the output of the pre-distortion unit 102 is a vector, as follows:

$$a_{bb}(n) = [a_{bb,0}(n), a_{bb,1}(n), \ldots, a_{bb,P-1}(n)]^T = [f_{bf,0}(s_{bb}(n)), f_{bf,1}(s_{bb}(n)), \ldots f_{bf,P-1}(s_{bb}(n))]^T \quad (AK-03)$$

which can be written compactly as follows:

$$a_{bb}(n) = F_{bf}(s_{bb}(n)) \quad (AK-04)$$

The weights (coefficients) AKC are given by the vector, w, as follows:

$$w = [w_0, w_1, \ldots, w_{P-1}]^T \quad (AK-05)$$

The multiplier 104 performs the following operation to produce the output signal AKE, which corresponds to the output ACH of the pre-distorter 68 of FIG. 5, as follows:

$$b_{bb}(n) = \sum_{p=0}^{P-1} a_{bb,p}(n) \cdot w_p = a_{bb}(n)^T \cdot w_i \quad (AK-06)$$

An advantage of the embodiment of FIG. 5 is that only one single-input pre-distorter is used, so that only one set of basis functions and one set of coefficients are generated. Further, since the basis functions, f, have only one argument, only a 1-dimensional look-up table is needed to store the coefficients of the basis functions, as opposed to a 2-dimensional look up table used for basis functions having two arguments.

Figure 8:
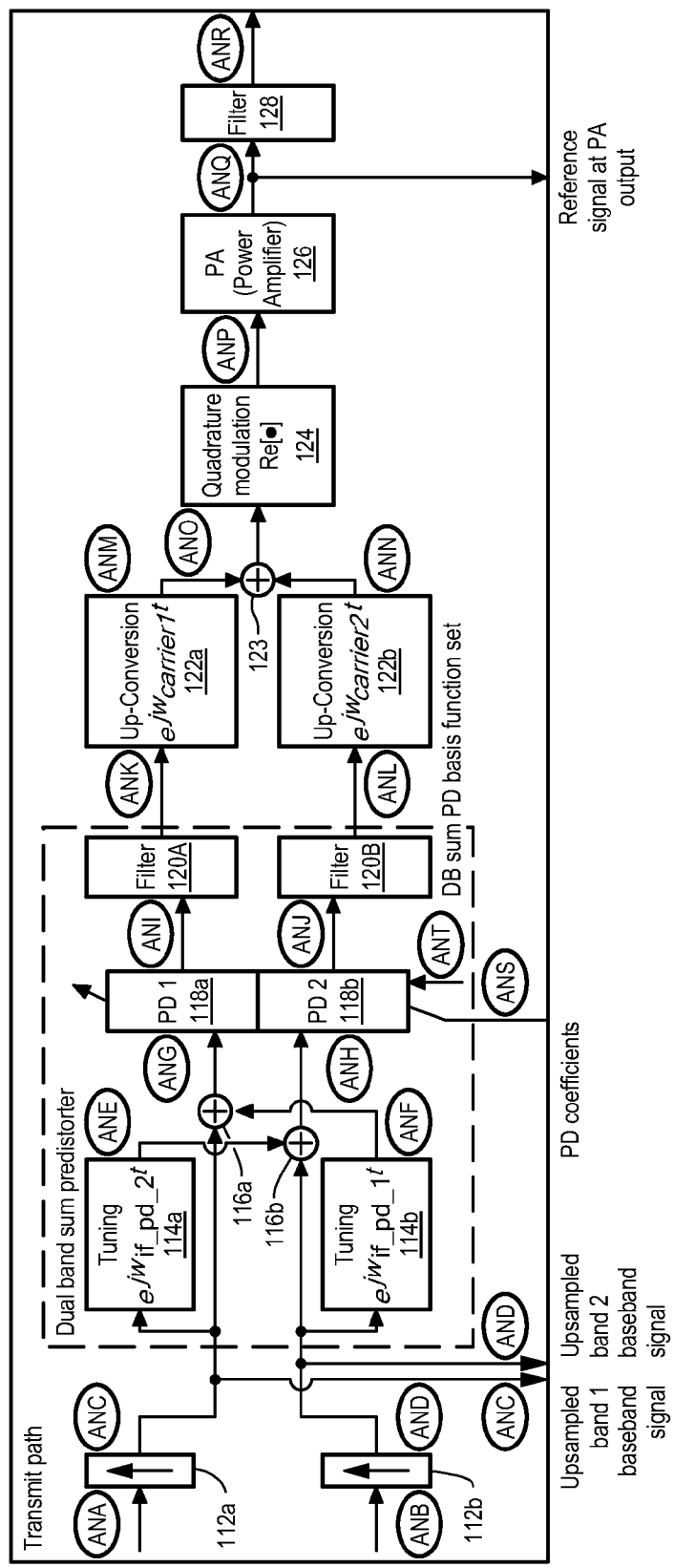
FIG. 8 is an exemplary block diagram of a dual band sum pre-distorter constructed in accordance with principles of the present invention.

FIG. 8 is a block diagram of an alternative embodiment of a dual band sum pre-distortion transmit circuit 110. As before, a first input signal ANA is a baseband signal with energy predominantly in a first band A. A second input signal is a baseband signal with energy predominantly in a second band B. The signal ANA is up-sampled by a first up-sampler 112a and the signal ANB is up-sampled by a second up-sampler 112b to produce the following up-sampled signals ANC and AND, respectively:

$$s_{bb,band-A}(n) \quad (AN-01)$$

and $$s_{bb,band-B}(n) \quad (AN-02)$$

The first signal ANC is tuned by tuner 114a to produce signal ANE, and the second signal AND is tuned by tuner 114b to produce signal ANF. The signals ANC and ANF are combined at adder 116a to produce signal ANG and the signals AND and ANE are combined at adder 116b to produce signal ANH.

The signal ANG is given by:

$$s_{db\text{-}sum,bb,1}(n) = s_{bb,band\text{-}A}(n) + s_{db\text{-}sum,if,band\text{-}B}(n) \quad \text{(AN-04)}$$

where $$S_{db\text{-}sum,if,band\text{-}B}(n) = s_{bb,band\text{-}B}(n) \cdot \exp(j2\pi f_{if\text{-}pd\text{-}1} nT_s) \quad \text{(AN-03)}$$

The signal ANH is given by:

$$s_{db\text{-}sum,bb,2}(n) = s_{bb,band\text{-}B}(n) + s_{db\text{-}sum,if,band\text{-}A}(n) \quad \text{(AN-14)}$$

where $$S_{db\text{-}sum,if,band\text{-}A}(n) = s_{bb,band\text{-}A}(n) \cdot \exp(j2\pi f_{if\text{-}pd\text{-}2} nT_s) \quad \text{(AN-13)}$$

The signals ANG and ANH are input to the pre-distorters 118a and 118b, respectively. The outputs ANI and ANJ of the pre-distorters 118a and 118b, respectively are given by:

$$s_{db\text{-}sum,bb,pd,1}(n) = f_{db\text{-}sum,pd}(S_{db\text{-}sum,bb,1}(n)) \quad \text{(AN-05)}$$

$$s_{db\text{-}sum,bb,pd,2}(n) = f_{db\text{-}sum,pd}(S_{db\text{-}sum,bb,2}(n)) \quad \text{(AN-15)}$$

The basis functions ANT, f, are the same for both pre-distorters. Similarly, the coefficients ANS, w, are the same for both pre-distorters.

Each of the signals ANI and ANJ have significant energy components in 4 bands, A, B, C, and D.

ANI can be expressed as:

$$\begin{aligned} s_{db-sum,bb,pd,1}(n) = \ & s_{db-sum,bb,pd,1,band-A}(n) + \\ & s_{db-sum,bb,pd,1,band-B}(n) \cdot \exp(j2\pi f_{if-pd} nT_s) + \\ & s_{db-sum,bb,pd,1,band-C}(n) \cdot \exp(-j2\pi f_{if-pd} nT_s) + \\ & s_{db-sum,bb,pd,1,band-D}(n) \cdot \exp(j4\pi f_{if-pd} nT_s) \end{aligned} \quad \text{(AN-10)}$$

ANJ can be expressed as:

$$\begin{aligned} s_{db-sum,bb,pd,2}(n) = \ & s_{db-sum,bb,pd,2,band-A}(n) \cdot \exp(-j2\pi f_{if-pd-2} nT_s) + \\ & s_{db-sum,bb,pd,2,band-B}(n) + \\ & s_{db-sum,bb,pd,2,band-C}(n) \cdot \exp(-j4\pi f_{if-pd-2} nT_s) + \\ & s_{db-sum,bb,pd,2,band-D}(n) \cdot \exp(j2\pi f_{if-pd-2} nT_s) \end{aligned} \quad \text{(AN-20)}$$

The energy of bands B, C and D are filtered out by filter 120a and the energy of bands A, C and D are filtered out by filter 120b to produce signals ANK and ANL, respectively, as follows:

$$s_{db\text{-}sum,bb,pd,band\text{-}A}(n) \quad \text{(AN-11)}$$

$$s_{db\text{-}sum,bb,pd,band\text{-}B}(n) \quad \text{(AN-21)}$$

The signal ANK and ANL are up-converted by up-converters 122a and 122b, respectively and the outputs ANM and ANN of the up-converters are added by an adder 123 to produce the signal ANO. The signal ANO is quadrature-modulated by the quadrature modulator 124 to produce the signal ANP. The signal ANP is the pre-distorted RF signals containing the information in bands A and B. This signal is input to the power amplifier 126 to produce the distorted pre-distorted RF signal ANQ as follows:

$$G_{pa} \cdot s_{db\text{-}sum,rf,nl\text{-}pd}(n) = G_{pa} \cdot f_{nl}(s_{db\text{-}sum,rf,nl\text{-}pd,band\text{-}AB}(n)) \quad \text{(AN-26)}$$

where $G_{pa}$ is the gain of the power amplifier and $f_{nl}$ is the non-linear function of the power amplifier 126.

In the embodiment of FIG. 8, the pre-distorters 118a and 118b both receive the same basis functions and coefficients. Unlike the embodiment of FIG. 5, in the embodiment of FIG. 8 the tuners after the pre-distorters may be omitted. However, two pre-distorters are used for the embodiment of FIG. 8, whereas only one pre-distorter is used for the embodiment of FIG. 5.

Figure 9:
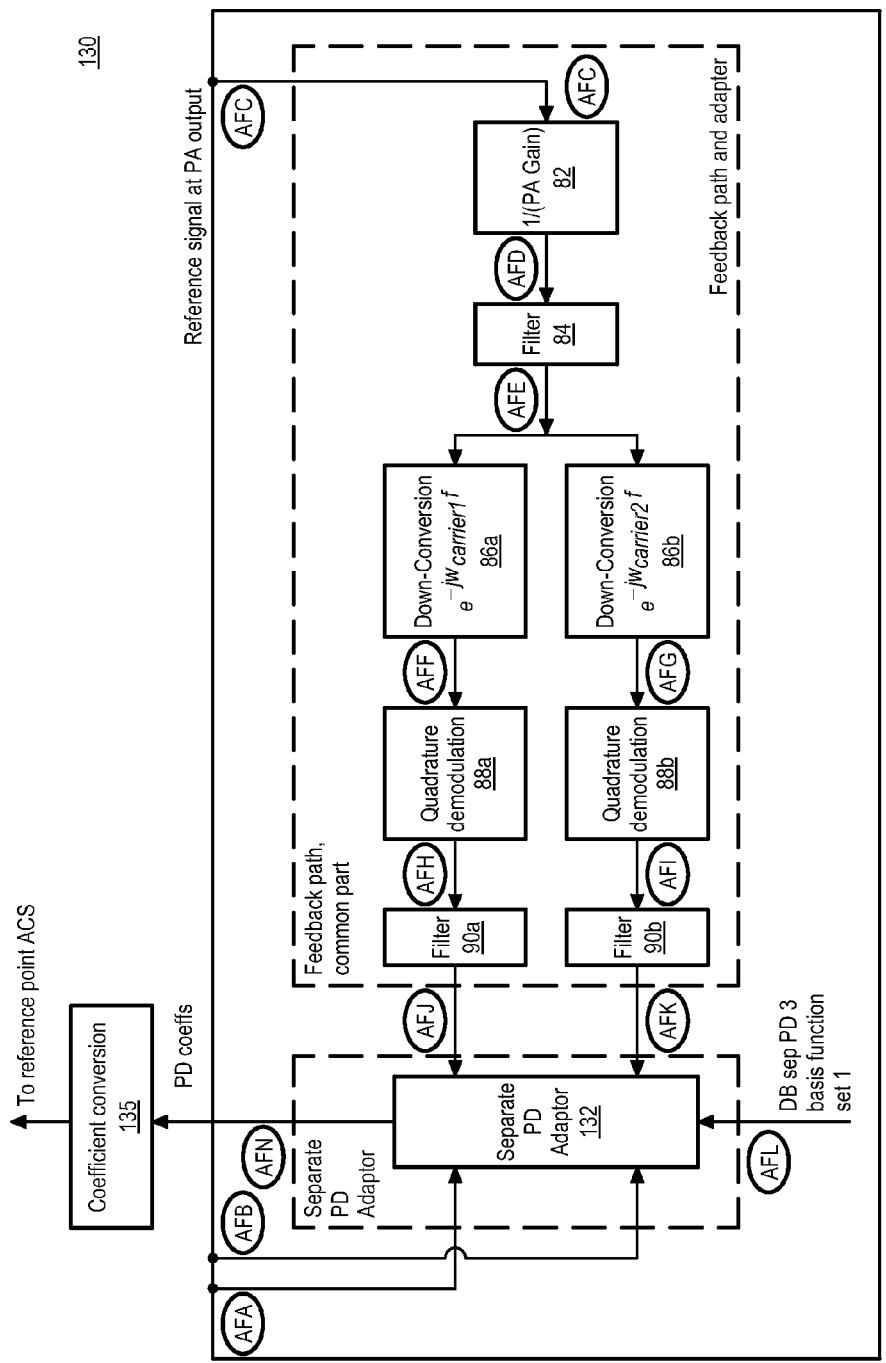
FIG. 9 is an exemplary block diagram of a pre-distortion modeler useable in conjunction with the dual band sum pre-distorter of FIG. 8.

FIG. 9 shows a pre-distortion modeler circuit 130 that may be used in conjunction with the dual band pre-distortion transmit circuit 110. The circuit 130 has two inputs AFA and AFB which correspond to the up-sampled baseband signals ANC and AND of FIG. 8. A third input AFC is the signal ANQ received from the power amplifier 126 of FIG. 8. The signal AFC is input to a feedback path that includes elements 82, 84, 86a, 86b, 88a, 88b, 90a, and 90b as discussed above with reference to FIG. 6. Consequently, the signals AFD, AFE, AFF, AFG, AFH, AFI, AFJ and AFK correspond to signals ADC, ADD, ADE, ADF, ADG, ADH, ADI and ADJ of FIG. 6, respectively. Also, the signals AFJ and AFK correspond to the frequency components centered at DC in signals ANG and ANH of FIG. 8, respectively.

The adaptor 132 produces a single set of pre-distortion coefficients AFN which can be connected directly to ANS in FIG. 8. Note that the pre-distorters 118a and 118b in FIG. 8 use a polynomial based architecture. The pre-distortion modeler circuit 130 can be used together with the dual band sum pre-distortion transmit circuit as shown in FIG. 5. When a polynomial based architecture is used for the pre-distorter 68 in FIG. 5, the coefficients AFN can be directly used as ACS. When a look-up table based architecture is used for the pre-distorter 68 in FIG. 5, the coefficients AFN for the polynomial based architecture need to be converted by a coefficient conversion unit 134 into the coefficients ANS for a look-up table based architecture.

Figure 10:
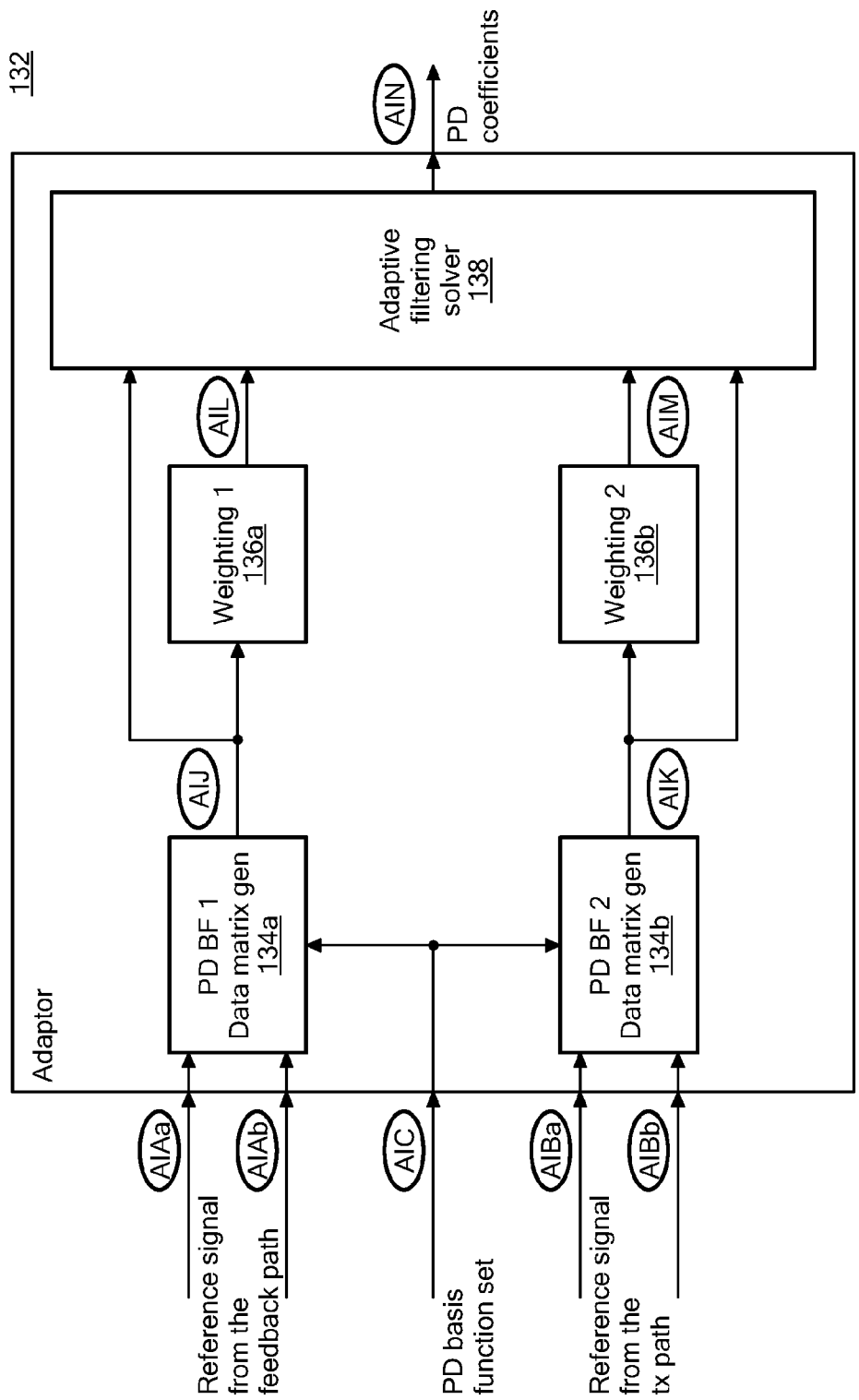
FIG. 10 is an exemplary block diagram of an adaptor for computing coefficients for a pre-distorter constructed in accordance with principles of the present invention.

FIG. 10 shows an adaptor for use with the embodiments shown in FIGS. 8 and 9. In FIG. 10, each data matrix generator 134a and 134b receive two signal inputs. For instance, the data matrix generator 134a receives signals AIAa and AIAb which correspond to the signals AFJ and AFK of FIG. 9. The data matrix generator 134b receives signals AIBa and AIBb which correspond to the signals AFA and AFB of FIG. 9. Each of the data matrix generators 134a and 134b receive a set of basis functions $$F_{db\text{-}sum,bf}(\cdot,\cdot) \quad \text{(AI-15)}$$

where the function F receives as arguments, the signals AIAa and AIAb in the data matrix generator 134a, and the function F receives as arguments the signals AIBa and AIBb in the data matrix generator 134b. The functions F may be polynomial functions of the arguments, having terms of the form:

$$(s_1)^l (s_2)^m$$

where l and m are integers.

The output of the matrix generator 134a is signal AU given by:

$$A'_i = [a'(n_0), a'(n_1), \ldots, a'(n_{P-1})]^T \quad \text{(AI-16)}$$

where $$a'(n) = F_{bf}(s'_1(n), s'_2(n)) \quad \text{(AI-17)}$$

and where $s'_1(n)$, $s'_2(n)$ are the signals AIAa and AIAb, respectively. Similarly, the output of the matrix generator 134b is signal AIK given by:

$$A_i = [a(n_0), a(n_1), \ldots, a(n_{P-1})]^T \quad \text{(AI-18)}$$

where $$a(n) = F_{b_i}(s_1(n), s_2(n)) \quad \text{(AI-19)}$$

and where $s_1(n)$, $s_2(n)$ are the signals AIBa and AIBb, respectively.

Similar to the multiplier 56a of FIG. 4, the multiplier 136a computes:

$$A'_i \cdot w_i = b'_i = [b'(n_0), b'(n_1), \ldots, b'(n_{N-1})]^T \quad \text{(AI-20)}$$

where $$w_i = [w_{i,0}, w_{i,1}, \ldots, w_{i,P-1}]^T \quad \text{(AI-21)}$$

and vector b' is an N×1 vector, w is a P×1 vector, and the signal AIL is $$b'(n) = \sum_{p=0}^{P-1} a'(n)_p \cdot w_{i,p} \quad \text{(AI-22)}$$

Also, similar to the multiplier 56b of FIG. 4, the multiplier 136b computes:

$$A_i \cdot w_i = b_i = [b(n_0), b(n_1), \ldots, b(n_{N-1})]^T \quad \text{(AI-23)}$$

where the signal AIM is $$b(n) = \sum_{p=0}^{P-1} a_p(n) \cdot w_{i,p} \quad \text{(AI-24)}$$

The weights $w_{i+1}$ are calculated by an adaptive solver 138 by solving the following equation for $w_{i+1}$:

$$A_i \cdot w_{i+1} = b'_i \quad \text{(AI-25)}$$

The output of the adaptive solver 138 is labeled MN and is AFN of FIG. 9 In the embodiment that uses the receiver architecture 130 of FIG. 9 and the transmitter architecture 110 of FIG. 8, the signal AIN is the input ANS to the pre-distorters 118a and 118b. In the embodiment that used the receiver architecture 130 of FIG. 9 and the transmitter architecture 60 in FIG. 5, and in which the pre-distorter 68 of FIG. 5 uses a polynomial based architecture, the signal MN is the input ACS to the pre-distorter 68. The basis functions may be selected considering both the complexity and modeling performance.

Thus, embodiment 60 in FIG. 5 described herein enable pre-distortion using a single set of coefficients to generate pre-distortion. In this embodiment, the pre-distorter has only one input. Consequently, the coefficients may be converted to a one-dimensional look-up table. In an embodiment that uses the receiver architecture 130 of FIG. 9 with the transmitter architecture 60 of FIG. 5, and in which the pre-distorter 68 in FIG. 5 uses a look-up table based architecture, the signal AIN is converted by unit 134 in FIG. 9 to obtain the input ACS to the pre-distorter 68. The converted coefficients ACS are the entries to the look-up table.

The present invention can be realized in hardware, or a combination of hardware and software. Any kind of computing system, or other apparatus adapted for carrying out the methods described herein, is suited to perform the functions described herein. A typical combination of hardware and software could be a specialized computer system, having one or more processing elements and a computer program stored on a storage medium that, when loaded and executed, controls the computer system such that it carries out the methods described herein. The present invention can also be embedded in a computer program product, which comprises all the features enabling the implementation of the methods described herein, and which, when loaded in a computing system is able to carry out these methods. Storage medium refers to any volatile or non-volatile storage device.

Computer program or application in the present context means any expression, in any language, code or notation, of a set of instructions intended to cause a system having an information processing capability to perform a particular function either directly or after either or both of the following a) conversion to another language, code or notation; b) reproduction in a different material form.

It will be appreciated by persons skilled in the art that the present invention is not limited to what has been particularly shown and described herein above. In addition, unless mention was made above to the contrary, it should be noted that all of the accompanying drawings are not to scale. A variety of modifications and variations are possible in light of the above teachings without departing from the scope and spirit of the invention, which is limited only by the following claims.

What is claimed is:

1. A pre-distortion method for a radio that transmits a first band of a dual band signal at a first carrier frequency and transmits a second band of the dual band signal at a second carrier frequency, the method comprising:
   tuning a first signal $s_1$ having first signal information to a first intermediate frequency to produce a first tuned signal, the first intermediate frequency being less than the first carrier frequency and less than the second carrier frequency;
   tuning a second signal $s_2$ having second signal information to minus the first intermediate frequency to produce a second tuned signal; and
   pre-distorting a sum of the first tuned signal and the second tuned signal to produce a pre-distorted signal.

2. The method of claim 1, wherein values of the pre-distorted signal are obtained based on coefficients from a one-dimensional look-up table.

3. The method of claim 2, wherein the look-up table is addressed based on a magnitude of the sum of the first tuned signal and the second tuned signal.

4. The method of claim 1, further comprising:
   tuning the pre-distorted signal to minus the first intermediate frequency in a first channel to produce a first tuned pre-distorted signal having the first signal information at baseband; and
   tuning the pre-distorted signal to the first intermediate frequency in a second channel to produce a second tuned pre-distorted signal having the second signal information at baseband.

5. The method of claim 4, further comprising:
   filtering the first tuned signal to extract the first signal information; and
   filtering the second tuned signal to extract the second signal information.

6. The method of claim 5, further comprising;
   up-converting the first signal information to the first carrier frequency; and
   up-converting the second signal information to the second carrier frequency.

7. A method of pre-distorting a dual band signal to compensate for distortion of a power amplifier in a transmitter that transmits a first band of the dual band signal at a first carrier frequency and transmits a second band of the dual band signal at a second carrier frequency, the method comprising:
   tuning a first signal $s_1$ having first signal information to a first intermediate frequency to produce a first tuned signal, the first intermediate frequency being less than the first carrier frequency and less than the second carrier frequency;

tuning a second signal $s_2$ having second signal information to a second intermediate frequency to produce a second tuned signal;

adding the first signal to the second tuned signal to produce a third signal and adding the second signal to the first tuned signal to produce a fourth signal;

inputting the third signal into a first pre-distorter applying a first set of basis functions to the third signal to produce a first pre-distorted signal having the first signal information at baseband; and inputting the fourth signal into a second pre-distorter applying the first set of basis functions to the fourth signal to produce a second pre-distorted signal having the second information signal at baseband.

8. The method of claim 7, further comprising:
filtering the first pre-distorted signal to extract the first signal information; and
filtering the second pre-distorted signal to extract the second signal information.

9. The method of claim 8, further comprising:
up-converting the first signal information to the first carrier frequency; and
up-converting the second signal information to the second carrier frequency.

10. The method of claim 7, further comprising substantially simultaneously applying the first set of basis functions to the first signal and the second signal to generate a set of pre-distortion coefficients, wherein the first pre-distorted signal and the second pre-distorted signal are based on the pre-distortion coefficients.

11. The method of claim 7, further comprising substantially simultaneously applying the first set of basis functions to a pair of feedback signals derived from an output of the power amplifier to generate a set of pre-distortion coefficients, wherein the first pre-distorted signal and the second pre-distorted signal are based on the pre-distortion coefficients.

12. The method of claim 7, further comprising multiplying a first set of coefficients by the first set of basis functions applied to the third signal to produce the first pre-distorted signal.

13. The method of claim 11, further comprising obtaining the first set of coefficients from a one-dimensional look-up table that is addressed based on a magnitude of the first tuned signal and the second tuned signal.

14. A radio frequency, RF, transmitter, comprising:
a first tuner tuning a first information signal $s_1$ to a first intermediate frequency to produce a first tuned signal, the first intermediate frequency being less than a first carrier frequency at which the RF transmitter transmits the first information signal;
a second tuner tuning a second information signal $s_2$ to minus the first intermediate frequency to produce a second tuned signal, the first intermediate frequency also being less than a second carrier frequency at which the RF transmitter transmits the second information signal; and
a pre-distorter applying a set of basis functions to pre-distort a sum of the first tuned signal and the second tuned signal according to a set of basis functions to produce a pre-distorted signal.

15. The RF transmitter of claim 14, further comprising
a third tuner tuning the pre-distorted signal to minus the first intermediate frequency in a first channel to produce a first tuned pre-distorted signal having the first signal information at baseband; and
a fourth tuner tuning the pre-distorted signal to the first intermediate frequency in a second channel to produce a second tuned pre-distorted signal having the second signal information at baseband.

16. The RF transmitter of claim 15, further comprising:
a first filter filtering the first tuned signal to extract the first signal information; and
a second filter filtering the second tuned signal to extract the second signal information.

17. The RF transmitter of claim 16, further comprising;
a first up-converter up-converting the first signal information to the first carrier frequency to produce a first up-converted signal;
a second up-converter up-converting the second signal information to the second carrier frequency to produce a second up-converted signal; and
a power amplifier amplifying a sum of the first up-converted signal and the second up-converted signal to produce an amplified signal.

18. The RF transmitter of claim 17, further comprising:
a first down-converter to down-convert the amplified signal to produce a first down-converted signal;
a second down-converter to down-convert the amplified signal to produce a second down-converted signal;
a fifth tuner to tune the first down-converted signal to minus the first intermediate signal to produce a first reference signal; and
a sixth tuner to tune the second down-converted signal to the first intermediate signal to produce a second reference signal.

19. The RF transmitter of claim 18, further comprising:
an adaptor, the adaptor:
applying a first set of basis functions to a sum of the first reference signal and the second reference signal; and
applying the first set of basis functions to a sum of the first signal and the second signal, to produce a first set of coefficients, the pre-distorted signal being based at least in part on the first set of coefficients.

20. The RF transmitter of claim 19, further comprising a coefficient converter to convert a first set of coefficients of a polynomial based pre-distorter to a second set of coefficients of a look-up table based pre-distorter, wherein the second set of coefficients are entries to a look-up table.

* * * * *

UNITED STATES PATENT AND TRADEMARK OFFICE
CERTIFICATE OF CORRECTION

| | |
|---|---|
| PATENT NO. | : 8,619,906 B2 |
| APPLICATION NO. | : 13/541972 |
| DATED | : December 31, 2013 |
| INVENTOR(S) | : Bai |

It is certified that error appears in the above-identified patent and that said Letters Patent is hereby corrected as shown below:

On the Title Page, Item (54), and in the Specification, Column 1, Line 3, in Title, delete "AMPLIFIFICATION" and insert -- AMPLIFICATION --, therefor.

In the Specification

In Column 2, Line 64, delete "signal" and insert -- signal. --, therefor.

In Column 8, Line 61, delete "MG" and insert -- AIG --, therefor.

In Column 8, Line 66, delete "MB" and insert -- AIB --, therefor.

In Column 8, Line 67, delete "MG" and insert -- AIG --, therefor.

In Column 9, Line 62, delete "MB." and insert -- AIB. --, therefor.

In Column 10, Line 67, delete "follows;" and insert -- follows: --, therefor.

In Column 11, Line 36, delete "78," and insert -- 78. --, therefor.

In Column 12, Line 1, delete "MB" and insert -- AIB --, therefor.

In Column 12, Line 2, delete "MC" and insert -- AIC --, therefor.

In Column 12, Line 4, delete "MC" and insert -- AIC --, therefor.

In Column 12, Line 11, delete "MC" and insert -- AIC --, therefor.

In Column 12, Line 15, delete "MH" and insert -- AIH --, therefor.

In Column 15, Line 33, delete "MN" and insert -- AIN --, therefor.

In Column 15, Line 34, delete "FIG. 9" and insert -- FIG. 9. --, therefor.

Signed and Sealed this
Fifteenth Day of July, 2014

Michelle K. Lee
*Deputy Director of the United States Patent and Trademark Office*

CERTIFICATE OF CORRECTION (continued)
U.S. Pat. No. 8,619,906 B2

In Column 15, Line 40, delete "MN" and insert -- AIN --, therefor.

In the Claims

In Column 16, Line 53, in Claim 6, delete "comprising;" and insert -- comprising: --, therefor.

In Column 18, Line 8, in Claim 15, delete "comprising" and insert -- comprising: --, therefor.

In Column 18, Line 21, in Claim 17, delete "comprising;" and insert -- comprising: --, therefor.